United States Patent
Tran et al.

[11] Patent Number: 5,982,035
[45] Date of Patent: Nov. 9, 1999

[54] HIGH INTEGRITY BORDERLESS VIAS WITH PROTECTIVE SIDEWALL SPACER

[75] Inventors: Khanh Q. Tran; Sunil D. Mehta, both of San Jose, Calif.

[73] Assignee: Advanced Micro Devices, Inc., Sunnyvale, Calif.

[21] Appl. No.: 09/094,726

[22] Filed: Jun. 15, 1998

[51] Int. Cl.[6] .................................................. H01L 23/48
[52] U.S. Cl. ........................ 257/750; 257/758; 257/774
[58] Field of Search ................................. 257/750, 758, 257/760, 774; 438/622, 625, 627, 631, 636, 637, 639

[56] References Cited

U.S. PATENT DOCUMENTS 5,619,072  4/1997  Mehta ...................................... 257/774
5,702,981  12/1997 Maniar et al. ........................... 438/627
5,757,077  5/1998  Chung et al. ............................ 257/758

*Primary Examiner*—Sara Crane

[57] ABSTRACT

High integrity borderless vias are formed with a protective sidewall spacer on the exposed side surface of the underlying metal feature before depositing a barrier layer. Embodiments include depositing a dielectric capping layer on a metal feature having an ARC, e.g., TiN, etching to form a through-hole stopping on the capping layer, and then etching the exposed capping layer to form the protective sidewall spacer. Other embodiments include depositing a hard inorganic mask layer on the upper surface of the metal feature before depositing the capping layer, forming the through-hole, and sequentially etching the exposed capping layer to form the protective sidewall spacer and then the inorganic hard mask layer. Further embodiments include metal features without an ARC and retaining the inorganic mask layer on the upper surface of the metal feature.

16 Claims, 6 Drawing Sheets

HIGH INTEGRITY BORDERLESS VIAS WITH PROTECTIVE SIDEWALL SPACER

TECHNICAL FIELD

The present invention relates to high density, multi-metal layer semiconductor devices having interconnection patterns with highly reliable borderless vias. The invention has particular applicability in manufacturing high density multi-metal layer semiconductor devices with design features of 0.25 microns and under.

BACKGROUND ART

The escalating requirements for high densification and performance associated with ultra large scale integration semiconductor devices require design features of 0.25 microns and under, such as 0.18 microns, increased transistor and circuit speeds, high reliability and increased manufacturing throughput. The reduction of design features to 0.25 microns and under challenges the limitations of conventional interconnection technology, including conventional photolithographic, etching and deposition techniques.

Conventional methodology for forming patterned metal layers comprises a subtractive etching or etch back step as the primary metal patterning technique. Such a method involves the formation of a first dielectric layer on a semiconductor substrate, typically doped monocrystalline silicon, with conductive contacts formed therein for electrical connection with an active region on the semiconductor substrate, such as a source/drain region. A metal layer, such as aluminum (Al) or an Al alloy, is deposited on the first dielectric layer, and a photoresist mask is formed on the metal layer having a pattern corresponding to a desired conductive pattern. The metal layer is etched through the photoresist mask to form the conductive pattern comprising metal features separated by gaps, such as a plurality of metal lines with interwiring spacings therebetween. A dielectric layer, such as a spin-on-glass (SOG), is then applied to the resulting conductive pattern to fill in the gaps and the surface is planarized, as by conventional etching or chemical-mechanical polishing (CMP) planarization techniques.

As feature sizes, e.g., metal lines and interwiring spacings, shrink to 0.25 microns and below, such as 0.18 microns, it becomes increasingly difficult to satisfactorily fill the interwiring spacings voidlessly and obtain adequate step coverage. It also becomes increasingly difficult to form a reliable interconnection structure. A through-hole is typically formed in a dielectric layer to expose an underlying metal feature, wherein the metal feature serves as a landing pad occupying the entire bottom of the through-hole. Upon filling the through-hole with conductive material, such as a metal plug to form a conductive via, the entire bottom surface of the conductive via is in direct contact with the metal feature.

The conventional practice of forming a landing pad completely enclosing the bottom surface of a conductive via utilizes a significant amount of real estate on a semiconductor chip, which is antithetic to escalating requirements for high densification. In addition, the reduction in design features to about 0.25 microns and under necessitates openings with very high aspect ratios (height/diameter), e.g. greater than about 4. As the aspect ratio of openings increases, the difficulty in depositing a barrier layer lining in the opening, as by conventional sputtering techniques, increases significantly. Accordingly, conventional remedial techniques comprise purposely widening the diameter of the through-hole to decrease the aspect ratio. As a result, misalignment occurs wherein the bottom surface of the conductive via is not completely enclosed by the underlying metal feature. This type of via is called a "borderless via", which also conserves chip real estate.

The use of borderless vias, however, creates new problems. For example, as a result of misalignment, the gap filling layer is penetrated by etching when forming a through-hole, due to the low density and poor stability of conventional filling materials, such as SOG. As a result of such penetration, moisture and gas accumulate, thereby increasing the resistance of the interconnection. Moreover, spiking can occur, i.e., penetration of the metal plug to the substrate causing a short. The use of borderless vias is also problematic in that a side surface of a metal feature is exposed to etching during formation of the through-hole.

In U.S. Pat. No. 5,619,072, a borderless via is disclosed wherein a metal feature is provided with sidewall spacers to alleviate the spiking problem. In copending application Ser. No. 08/924,131, filed on Sep. 5, 1997, a titanium nitride barrier layer is deposited by CVD to prevent undercutting of the side surface of the underlying metal feature in a borderless via.

As the aspect ratios of a through-hole increase, however, and metal features are scaled further, it becomes increasingly difficult to satisfactorily deposit a barrier layer on the side surface of a metal feature. Conventional metal features comprise a primary conductive layer of Al. Conductive plugs are typically comprised tungsten deposited from tungsten hexafluoride ($WF_6$) vapor which undesirable reacts with Al. This problem is illustrated in FIG. 1 wherein metal feature 11 is formed on insulating layer 10. Metal feature 11 is part of a patterned metal layer typically comprising a lower metal layer e.g., titanium (Ti) or W, (not shown), primary intermediate metal layer 11A, such as Al, and an upper anti-reflective coating (ARC) 11B, such as titanium nitride (TiN). Second dielectric layer 12 is formed on the patterned metal layer and through-hole 13 is formed therein, as by anisotropic etching. Through-hole 13 is intentionally misaligned, thereby exposing a portion 11B and a side surface 112 of metal feature 11. Side surface 112 is typically etched upon forming through-hole 13 forming an undercut portion in the form of a cavity. The difficulty in depositing a barrier layer on the undercut concave portion prior to filling the through-hole under such circumstances becomes acutely problematic. Barrier layer 14, typically TiN, does not uniformly cover the cover side surface 112, as shown by discontinuity 15. Accordingly, during deposition of W to fill the through-hole, as with conventional vapor deposition employing $WF_6$, Al reacts violently with $WF_6$ resulting in an unreliable interconnection.

Accordingly, there exists a need for methodology enabling the formation of a reliable borderless via, particularly when filling high aspect ratio openings. There exist a particular need for methodology enabling the formation of a reliable borderless via while avoiding interaction of the plug filling material with an underlying metal feature.

DISCLOSURE OF THE INVENTION

An object of the present invention is a high density multilevel semiconductor device with an interconnection pattern comprising highly reliable borderless vias.

Another object of the present invention is a method of manufacturing a high density multi-metal layer semiconductor device with design features of 0.25 microns with an interconnection pattern comprising highly reliable borderless vias.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a semiconductor device comprising: a first dielectric layer on a substrate; a first patterned metal layer, comprising a metal feature with an upper surface and first and second side surfaces, on the first dielectric layer; a capping layer comprising: a first portion on a first part of the upper surface and on the first side surface of the metal feature; and a second portion, spaced apart from the first portion, forming a sidewall spacer on the second side surface of the metal feature; a second dielectric layer formed on the patterned metal layer; a through-hole having an internal surface in the second dielectric layer exposing the sidewall spacer; a barrier layer on the internal surface of the through-hole and on the sidewall spacer; and conductive material filling the through-hole forming a borderless via.

Another aspect of the present invention is a semiconductor device comprising: a first dielectric layer on a substrate; a patterned metal layer comprising a metal feature with an upper surface and first and second side surfaces, on the first dielectric layer, which metal feature contains a primary conductive layer and anti-reflective coating thereon; an inorganic mask layer on a first part, leaving uncovered a second part, of the upper surface of the metal feature, the inorganic mask layer comprising an upper surface and first and second side surfaces; a capping layer, of a material different from the inorganic mask layer, comprising: a first portion on the upper surface and first side surface of the inorganic mask layer; and a second portion spaced apart from the first portion and forming a sidewall spacer on the second side surface of the metal feature completely covering the primary conductive layer; a second dielectric on the patterned metal layer; a through-hole having an internal surface in the second dielectric layer exposing the sidewall spacer and second part of the upper surface of the metal feature; a barrier layer on the internal surface of the through-hole, the second part of the metal feature and on the sidewall spacer; and conductive material filling the through-hole forming a borderless via.

A further aspect of the present invention is a semiconductor device comprising: a first dielectric layer on a substrate; a patterned metal layer comprising a metal feature with an upper surface and first and second side surfaces on the first dielectric layer; an inorganic mask layer on the substantially upper surface of the metal feature; a capping layer, of the material different from the inorganic mask layer, comprising: a first portion on a first part, leaving uncovered a second part, of the upper surface of the inorganic mask layer proximate the second side surface of the metal feature and on the first side surface of the metal feature; and a second portion spaced apart from the first portion and comprising a sidewall spacer completely covering the second side surface of the metal feature; a second dielectric on the patterned metal layer; a through-hole having an internal surface in the second dielectric layer exposing the sidewall spacer and second part of the upper surface of the inorganic mask layer; a barrier layer on the internal surface of the through-hole, the second part of the upper surface of the inorganic mask layer and on the sidewall spacer; and conductive material filling the through-hole forming a borderless via.

Another aspect of the present invention is a method of manufacturing a semiconductor device, the method comprising: forming a patterned metal layer on a first dielectric layer, wherein the patterned metal layer comprises a metal feature with an upper surface and first and second side surfaces; depositing a capping layer on the upper surface and first and second side surfaces of the metal feature; forming a second dielectric layer on the patterned metal layer, which second dielectric layer comprises a material different from the capping layer; etching to form a through-hole having an internal surface in the second dielectric layer exposing a part of the capping layer on the upper surface and second side surface of the metal feature; etching to remove the exposed part of the capping layer on the upper surface of the metal feature leaving part of the capping layer to form a sidewall spacer on the second side surface of the metal feature; depositing a barrier layer on the internal surface of the through-hole and on the sidewall spacer; and filling the through-hole with conductive material to form a borderless via.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

Figure 1:
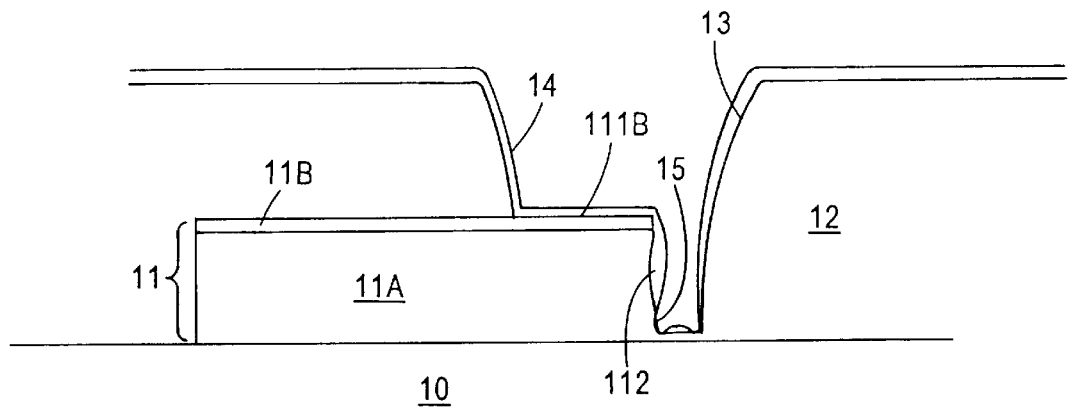
FIG. 1 schematically illustrates a conventional borderless via with an exposed side surface of the underlying metal feature.

The present invention addresses and solves reliability problems attended upon forming a borderless via, particularly the undercutting problem and inadequate coverage of the side surface of an underlying metal feature by a barrier layer 14 as illustrated in FIG. 1, i.e., an exposed portion 15 of the side surface of the underlying metal feature 11. The inability to adequately cover the entire side surface of the primary conductive portion 11A, typically comprising Al, leads to an undesirable reaction with $WF_6$ during plug filling. Moreover, if the barrier layer is not formed directly on the entire side surface of the primary conductive portion 11A, the resulting interconnection would contain a void and etching residues which adversely affect device performance. The present invention provides cost effective, efficient methodology for forming borderless via interconnections, including high aspect ratio vias.

Embodiments of the present invention include forming a borderless via interconnecting a lower metal feature comprising a primary conductive layer of Al and an ARC, typically TiN. Undercutting of the side surface of the metal feature and protection against undesirable reaction with $WF_6$ during subsequent deposition are prevented by strategically depositing a capping layer on the upper surface and side surfaces of the metal feature prior to depositing the dielectric interlayer and forming a misaligned through-hole therein. The capping layer comprises a dielectric material different from the dielectric interlayer in which the misaligned through-hole for the borderless via is formed. Typically, the dielectric interlayer comprises a silicon oxide, such as silicon dioxide derived from tetraethyl orthosilicate or silane by plasma enhanced chemical vapor deposition (PECVD). The capping layer serves as an etch stop layer when etching the misaligned through-hole for the borderless via. Accordingly, in employing a silicon oxide dielectric interlayer in which the misaligned through-hole is formed, the capping layer typically comprises a nitride or oxynitride, such as silicon nitride or silicon oxynitride. The capping layer can be deposited at a thickness of about 250 Å to about 1,000 Å, typically about 500 Å. After depositing the capping layer, the dielectric interlayer is deposited and a misaligned through-hole formed therein, as by anisotropic etching.

In etching to form the misaligned through-hole, an etchant is employed which has a high selectivity with respect to the capping layer so that etching stops upon reaching the capping layer. Accordingly, upon forming the misaligned through-hole, a portion of the capping layer on an upper surface and side surface of the misaligned through-hole is exposed. A second etching step is then conducted, such as anisotropic etching, to remove the exposed portion of the capping layer from the upper surface of the underlying metal feature, leaving a portion of the capping layer constituting a sidewall spacer covering the entire side surface of the primary conductive portion (Al) of the underlying metal feature, and typically part of the side surface of the ARC. Thus, the side surface of the underlying metal feature is protected by the capping layer when etching to form a misaligned through-hole and a portion of a capping layer constituting a sidewall spacer is formed on at least the entire side surface of the primary conductive layer (Al) prior to depositing the barrier layer. Since the entire side surface of the primary conductive layer (Al) is protected by the sidewall spacer, the barrier layer can be deposited without concern for generating discontinuities.

Other embodiments of the present invention include depositing a hard inorganic mask layer, comprising a dielectric material different from the capping layer, on the upper surface of the underlying metal feature prior to depositing the capping layer. After etching the misaligned through-hole, a second etching step is conducted to remove a portion of the exposed capping layer from the upper surface of the inorganic hard mask leaving a portion of the capping layer constituting a sidewall spacer extending on and above the side surface of the underlying metal feature, and on a portion of the side surface of the exposed inorganic mask layer. Another etching step is then conducted to remove the exposed portion of the inorganic mask layer, leaving the sidewall spacer extending above the upper surface of the underlying metal feature. This embodiment provides an increased margin of safety in that the sidewall spacer extends above the upper surface of the underlying metal feature.

Other embodiments of the present invention comprise forming the underlying metal layer and, hence, metal feature without an upper ARC. In such embodiments, the inorganic mask layer is retained on the upper surface of the metal feature, while the sidewall spacer extends on the side surface and above the upper surface of the underlying metal feature, thereby providing complete protection against reaction with $WF_6$ during subsequent plug filling. Accordingly, a barrier layer can be deposited and, in the event of a discontinuity, the side surface of the metal feature is protected by the capping layer and the upper surface of the metal feature is protected by the inorganic mask layer. The inorganic mask layer can comprise an oxide or oxynitride, such as silicon oxide or a silicon/oxynitride, while the capping layer can comprise a nitride, such as silicon nitride. The inorganic mask layer can be deposited at a thickness of about 500 Å to about 1,500 Å.

As in conventional practices, the ARC can comprise a material typically employed as an ARC, such as TiN. The barrier layer deposited according to the present invention, can comprise a barrier metal typically employed in forming vias, such as titanium, titanium nitride, titanium-titanium nitride, tungsten, titanium-tungsten, tantalum or tantalum nitride. The barrier layer can also comprise a CVD titanium nitride.

Figure 2:
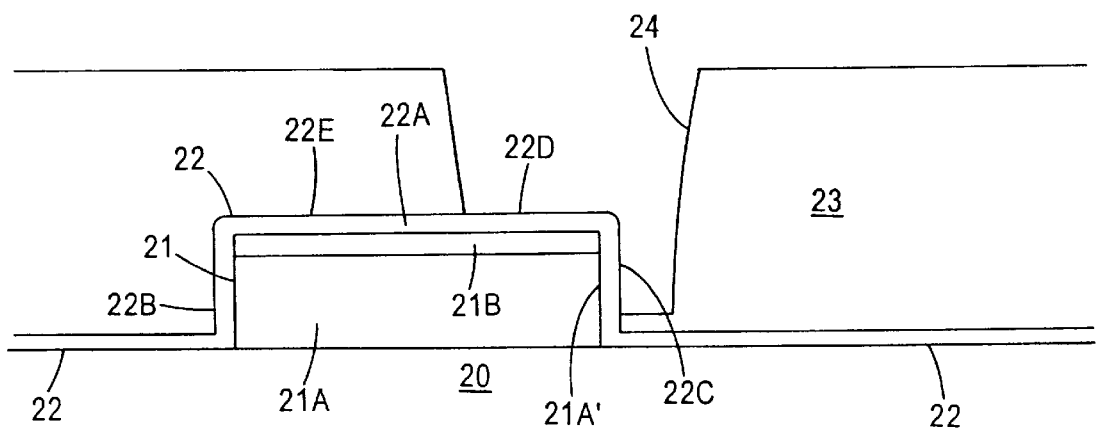
FIGS. 2–4 schematically illustrated sequential phases of a method in accordance with an embodiment of the present invention.
Figure 3:
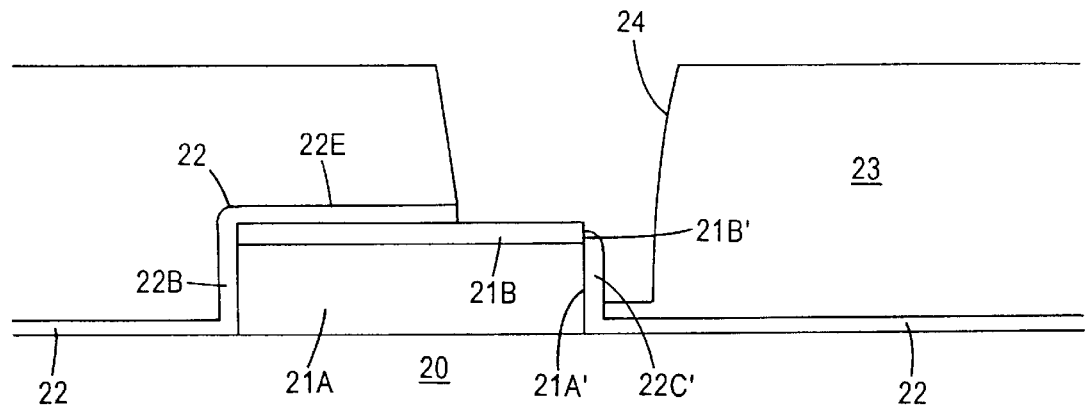
Figure 4:
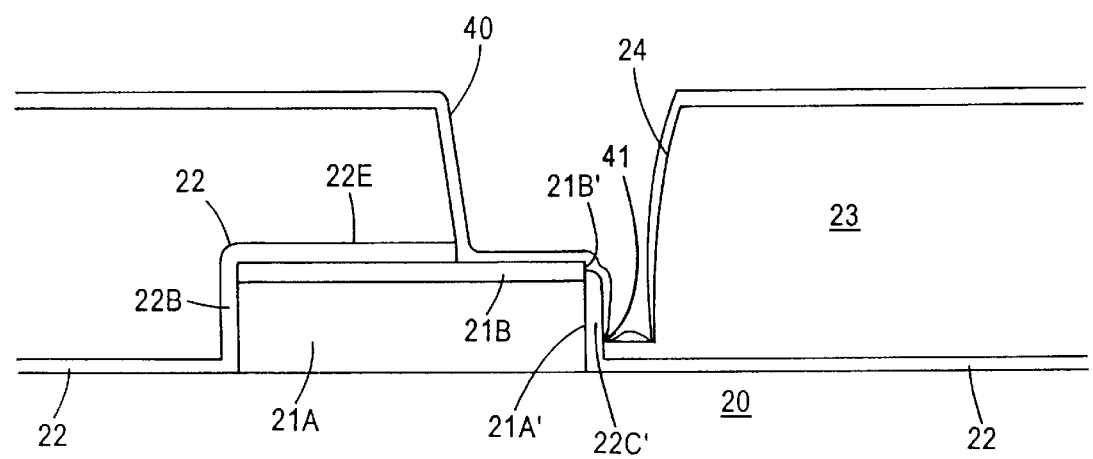
Figure 5:
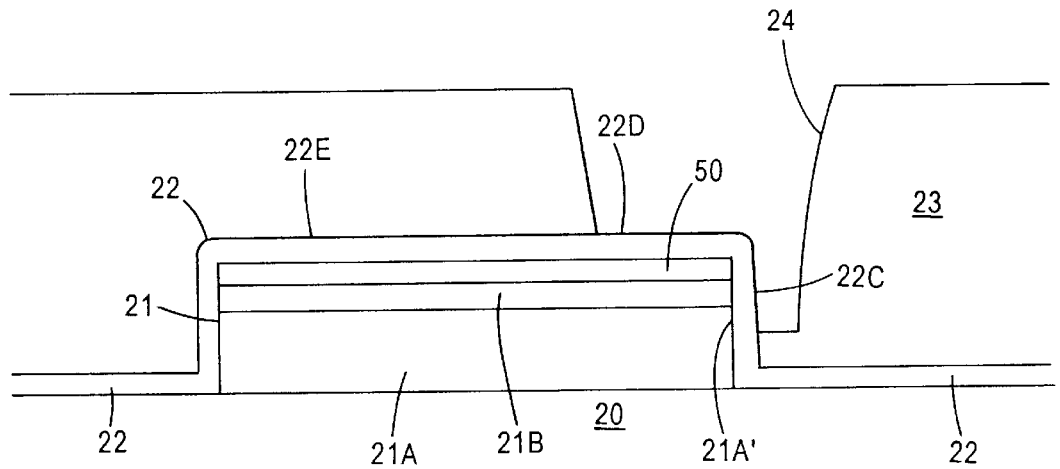
FIGS. 5–10 schematically illustrates sequential phases of a method in accordance with another embodiment of the present invention.

An embodiment of the present invention is schematically illustrated in FIGS. 2–4, wherein similar features bear similar reference numerals. Adverting to FIG. 2, metal feature 21 is formed on underlying dielectric layer 20 and comprises a primary conductive portion 21A and ARC 21B thereon. Capping layer 22 is deposited covering the upper surface of ARC 21 and the entire side surfaces of metal feature 21. In this embodiment, capping layer 22 can comprise a silicon nitride or a silicon oxynitride. Dielectric layer 23, e.g., a silicon oxide, is deposited and misaligned through-hole 24 formed therein exposing the portion 22D of capping layer 22 formed on the upper surface of ARC 21B and the portion 22C on the side surface 21A of metal feature 21. The through-hole is formed by etching with an etchant having a high selectivity for the silicon nitride or silicon oxynitride capping layer 22 vis-à-vis the silicon oxide dielectric interlayer 23, such as $C_4F_8$ and Ar.

After forming misaligned through-hole 24, etching is conducted, as illustrated in FIG. 3, to remove the exposed portion 22D of capping layer 22 and part of the upper surface of exposed portion 22C on the side surface 21A of metal feature 21, leaving a portion of capping layer 22 constituting a sidewall spacer 22C' covering the entire side surface 21A' of the primary conductive layer 21A, i.e., Al, and part of the side surface 21B' of ARC 21B. Thus, the entire side surface 21A' is covered by sidewall spacer 22C'.

As illustrated in FIG. 4, a barrier layer 40 is deposited on the internal surface of through-hole 24, on the upper surface of exposed ARC 21B and on sidewall spacer 22C'. The formation of a barrier layer discontinuity, as illustrated by reference numeral 41, on sidewall spacer 22C' does not adversely affect the reliability of the resulting borderless via, since the entire side surface 21A' of conductive layer 21A (Al) is protected by sidewall spacer 22C'. Thus, upon plug filling through-hole 24 with W employing $WF_6$, reaction with Al of primary conductive layer 21A is prevented by sidewall spacer 22C' on the entire side surface 21A'.

Another embodiment of the present invention is illustrated in FIGS. 5–10, wherein similar features bear similar reference numerals. The embodiment illustrated in FIGS. 5–10 differs from the embodiment illustrated in FIGS. 2–4, in that an inorganic mask layer 50 is deposited on the upper surface of ARC 21B. Thus, features in FIGS. 5–10 similar to those in FIGS. 2–4 also bear similar reference numerals. In the embodiment depicted in FIGS. 5–10, dielectric interlayer 23 can comprise silicon dioxide, inorganic mask layer 50 can comprise silicon oxide or a silicon oxynitride, while capping layer 22 can comprise silicon nitride. Adverting to FIG. 5, misaligned through-hole 24 is formed by etching employing an etchant having a high selectivity to silicon nitride capping layer 22 vis-à-vis silicon oxide dielectric interlayer 23, leaving a first portion 22D of capping layer 22 exposed on an upper surface of inorganic mask layer 50 and a second portion 22C on the entire side surface of metal feature 21 and side surface of inorganic mask layer 50. Reference number 22E denotes the portion of capping layer 22 which is not exposed when forming misaligned through-hole 24.

Figure 6:
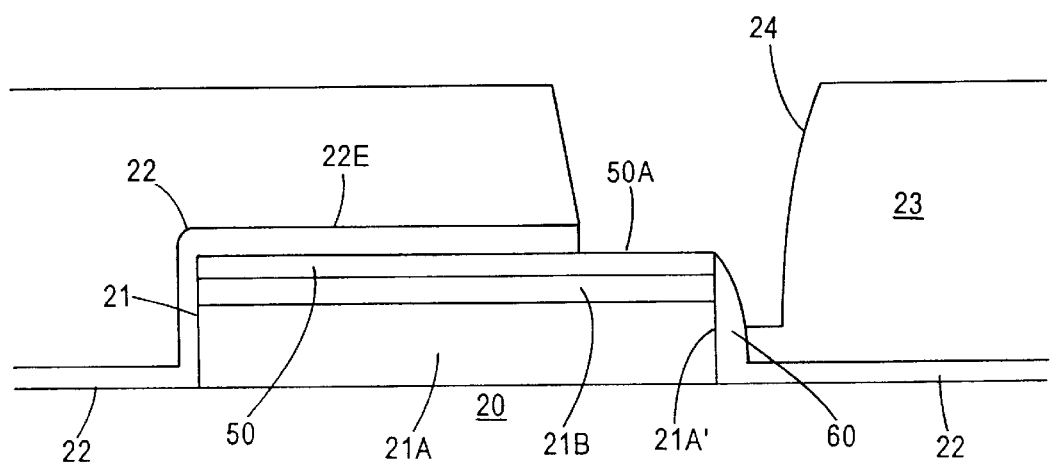

A second etching step is then conducted, as illustrated in FIG. 6, to remove the exposed first portion 22D of capping layer 22 leaving a part of the second portion 22C forming a sidewall spacer 60 covering the entire surface of metal feature 21 and at least a portion of the side surface of inorganic mask layer 50. The etchant employed in this second etching step to remove second portion 22D has a high selectivity with respect to the silicon oxide or silicon oxynitride inorganic mask layer, such as, $CH_3$ and $O_2$, such that etching stops on and exposes portion 50A of inorganic mask layer 50.

Figure 7:
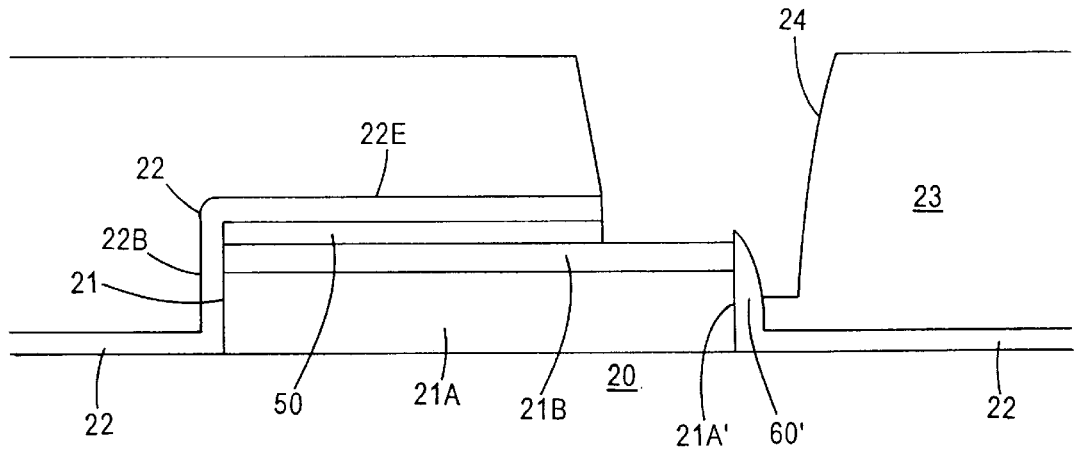

Another etching step is then conducted, as illustrated in FIG. 7, to selectively remove the exposed portion 50A of inorganic mask layer 50, leaving sidewall spacer 60' extending above the upper surface of metal feature 21, including above ARC 21B. Thus, the entire side surface of metal feature 21, including the entire side surface of primary conductive 21A, as well as the entire side surface of ARC 21B, is protected by sidewall spacer 60'. The etchant employed to selectively remove portion 50A exhibits a high selectivity with respect to the TiN ARC vis-à-vis the silicon oxide or silicon oxynitride inorganic mask layer, such as that employed to etch the through-hole 24 in silicon dioxide dielectric layer 23.

Figure 8:
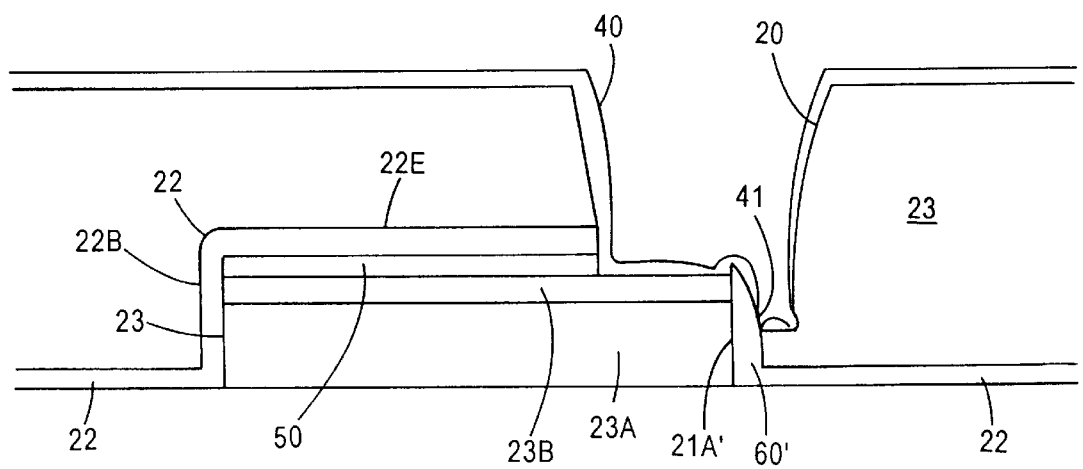
Figure 9:
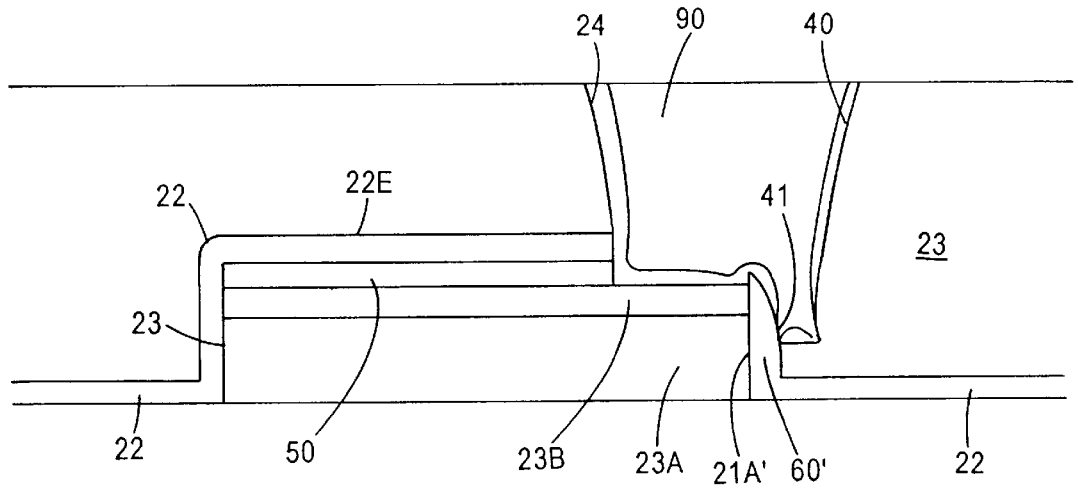

The conductive via is then completed by initially depositing barrier layer 40, as shown in FIG. 8, creating discontinuity 41, particularly in a high aspect ratio opening 24. The discontinuity 41 does not adversely impact ultimate via reliability, since reaction of $WF_6$ with the Al of primary conductive layer 23A is prevented by the presence of protective sidewall spacer 60' extending above the upper surface of ARC 23B providing an extra margin of protection. Adverting to FIG. 9, W plug 90 is deposited to fill through-hole 24 employing $WF_6$ and planarization is implemented, as by CMP.

Figure 10:
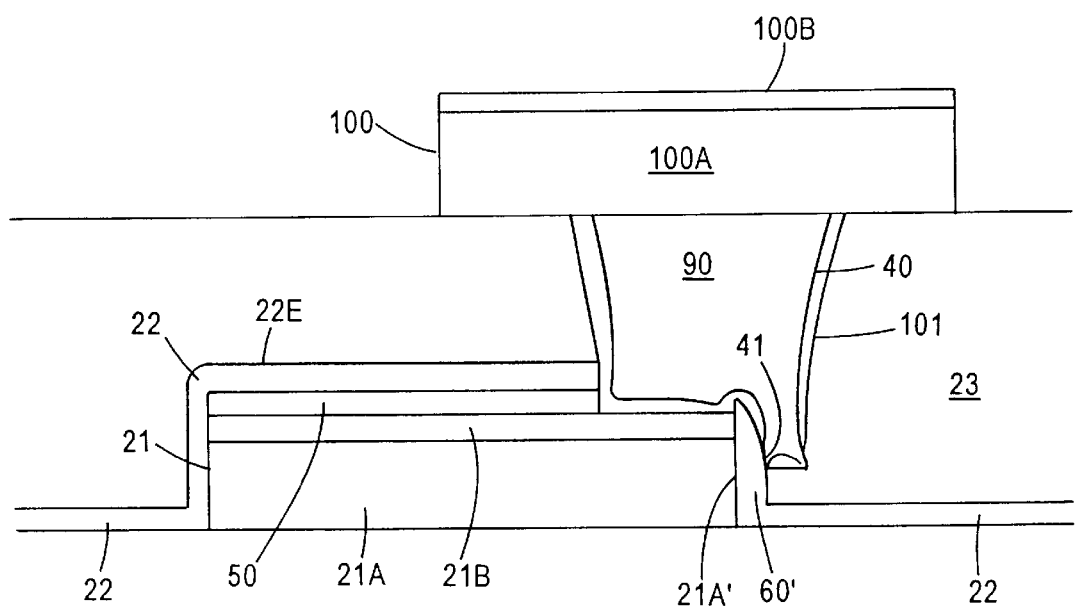

Adverting to FIG. 10, after planarization, a second metal feature 100 is formed on dielectric interlayer 23, comprising a primary conductive layer 100A (Al) and an ARC 100B, such as TiN thereon. Second metal feature 100 is electrically connected to underlying metal feature 21 by borderless via 101 comprising tungsten plug 90. The presence of sidewall spacer 60' enables the formation of a reliable borderless via 101 notwithstanding discontinuity 41 in barrier layer 40.

Figure 11:
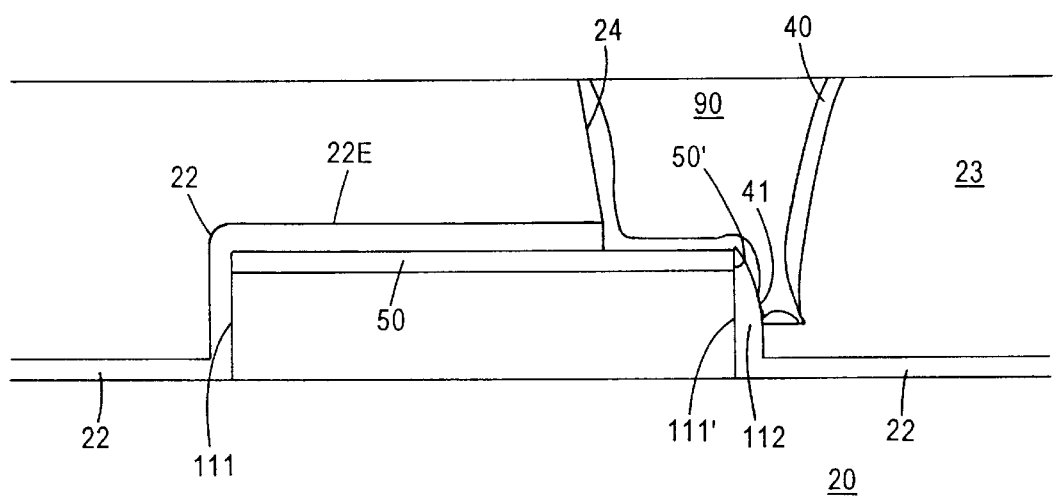
FIG. 11 illustrates another embodiment of the present invention.

Another embodiment of the present invention is illustrated in FIG. 11, wherein features similar to the previous discussed embodiments depicted in FIGS. 2–10, bear similar reference numerals. The embodiment illustrated of FIG. 11 differs from the embodiment depicted in FIGS. 5–10 in that metal feature 111 comprises a layer of Al without an ARC thereon. In the embodiment depicted in FIG. 11, after etching to remove exposed first portion 22D of capping layer 22 (FIGS. 5 and 6), the inorganic mask layer 50 remains on the entire upper surface of underlying metal feature 111.

Sidewall spacer 112, which constitutes the remaining portion of capping layer 22 after removing first portion 22D, extends on the entire side surface 111' of metal layer 111 and on at least a portion of the side surface 50' of inorganic mask layer 50. The presence of sidewall spacer 112 protects the entire side surface 111 ' of metal feature 111A (Al), thereby preventing interaction of Al with $WF_6$ when filling misaligned through-hole 24 with W 90 employing $WF_6$, not withstanding the discontinuity 41 in barrier layer 40.

In the various embodiments of the present invention, advantageous results have been achieved employing a silicon dioxide dielectric layer, a silicon nitride capping layer, and etching the through-hole with an etchant having a selectivity with respect to silicon nitride vis-à-vis silicon dioxide of at least 10:1, such as plasma etching using $C_4F_8$ and at a power of about 2,000 to about 3,000 watts. In etching the silicon nitride capping layer and stopping on a silicon dioxide inorganic mask layer, it has been found advantageous to plasma etch employing $CHF_3$ and $O_2$ at a power of about 1,500 to about 2,500 watts. In etching the silicon dioxide inorganic mask layer and stopping on a TiN ARC, the same etching chemistry can be employed as when etching the silicon dioxide interlayer to form the misaligned through-hole. Given the guidance and objectives set forth herein, optimum etchants and conditions can be readily determined in a particular situation.

The present invention enables the formation of reliable borderless vias by protecting the entire side surface of the primary conductive layer (Al) of an underlying metal feature with a dielectric sidewall spacer, such as silicon nitride. Accordingly, discontinuities in the barrier layer on the side surface of the underlying metal feature do not result in an undesirable reaction between $WF_6$ and Al. Moreover, the presence of the capping layer on the side surface of the underlying metal feature prevents undercutting. The present invention achieves such objectives in a cost-effective, efficient manner without requiring new or substantial modifications of in line production equipment and, hence, can be easily integrated in existing manufacturing facilities.

In the various embodiments of the present invention, a CVD TiN barrier layer can be formed, as disclosed in copending application Ser. No. 08/924,131, filed on Sep. 5, 1997, the entire disclosure which is hereby incorporated herein by reference.

The present invention is applicable to the production of various types of semiconductor devices. The present invention enjoys particular applicability in manufacturing high density, multimetal layer devices with submicron features of 0.25 microns and below, exhibiting high speed characteristics and improved interconnection reliability.

In carrying out the embodiments of the present invention, the metal layers can be deposited by any technique conventionally employed in manufacturing semiconductor devices, such as various CVD processes. In the previous descriptions, numerous specific details are set forth, such as specific materials, structures, chemicals process, processes, etc., in order to provide a through understanding of the present invention. However, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as disclosed herein.

What is claimed is:

1. A semiconductor device comprising:
   a first dielectric layer on a substrate;
   a first patterned metal layer, comprising a metal feature with an upper surface and first and second side surfaces, on the first dielectric layer, the metal feature comprising a primary conductive layer and an anti-reflective coating thereon;
   a capping layer comprising:
      a first portion on a first part of the upper surface and on the first side surface of the metal feature; and
      a second portion, spaced apart from the first portion, forming a sidewall spacer on the second side surface of the metal feature;
   an inorganic mask layer, comprising a material different from the capping layer, on the first part, leaving uncovered a second part, of the upper surface of the metal feature, the inorganic mask layer comprising an upper surface and first and second side surfaces;
   a second dielectric layer formed on the patterned metal layer;
   a through-hole having an internal surface in the second dielectric layer exposing the sidewall spacer;
   a barrier layer on the internal surface of the through-hole and on the sidewall spacer; and
   conductive material filling the through-hole forming a borderless via wherein:
      the capping layer is on the upper surface and first side surface of the inorganic mask layer;
      the sidewall spacer extends vertically above the entire second side surface of the metal feature; and
      the barrier layer is on a side surface of the capping layer, the second side surface of the inorganic mask layer and the second part of the upper surface of the metal feature.

2. The semiconductor device according to claim 1, wherein the first and second dielectric layers comprise silicon oxide.

3. The semiconductor device according to claim 2, wherein the inorganic mask layer functions as an etch stop layer with respect to the capping layer.

4. The semiconductor device according to claim 3, wherein the capping layer comprises a nitride and the inorganic mask layer comprises an oxide or oxynitride.

5. The semiconductor device according to claim 1, wherein the capping layer has a thickness of about 250 Å to about 1,000 Å.

6. The semiconductor device according to claim 1, wherein the barrier layer is selected from the group consisting of titanium, titanium nitride, titanium-titanium nitride, tungsten, titanium-tungsten, tantalum or tantalum nitride.

7. The semiconductor device according to claim 6, wherein the barrier material comprises titanium nitride deposited by chemical vapor deposition, the primary conductive layer comprises aluminum, the anti-reflective coating comprises titanium nitride and the conductive material comprises tungsten deposited from tungsten hexafluoride.

8. A semiconductor device comprising:
   a first dielectric layer on a substrate;
   a first patterned metal layer, comprising a metal feature with an upper surface and first and second side surfaces, on the first dielectric layer, the metal feature comprising a primary conductive layer;
   a capping layer comprising:
      a first portion on a first part of the upper surface and on the first side surface of the metal feature; and
      a second portion, spaced apart from the first portion, forming a sidewall spacer on the second side surface of the metal feature;
   an inorganic mask layer, comprising a material different from the capping layer and having an upper surface and first and second side surfaces, on substantially the entire upper surface of the metal feature;
   a second dielectric layer formed on the patterned metal layer;
   a through-hole having an internal surface in the second dielectric layer exposing the sidewall spacer;
   a barrier layer on the internal surface of the through-hole and on the sidewall spacer; and
   conductive material filling the through-hole forming a borderless via; wherein:
      the capping layer is on a first part, leaving uncovered a second part, of the upper surface of the inorganic mask layer proximate the second side surface of the metal feature;
      the sidewall spacer completely covers the second side surface of the metal feature; and
      the barrier layer is on the second part of the upper surface of the inorganic mask layer.

9. The semiconductor device according to claim 8, wherein the first and second sides surfaces of the inorganic mask layer are substantially vertically aligned with the first and second side surfaces, respectively, of the metal feature; and
   the barrier material layer is on an upper portion of the second side surface of the inorganic mask layer.

10. The semiconductor device according to claim 8, wherein the first and second dielectric layers comprise silicon oxide.

11. The semiconductor device according to claim 10, wherein the inorganic mask layer functions as an etch stop layer with respect to the capping layer.

12. The semiconductor device according to claim 11, wherein the capping layer comprises a nitride and the inorganic mask layer comprises an oxide or oxynitride.

13. The semiconductor device according to claim 8, wherein the capping layer has a thickness of about 250 Å to about 1,000 Å.

14. The semiconductor device according to claim 13, wherein the inorganic mask layer has a thickness of about 500 Å to about 1,000 Å.

15. The semiconductor device according to claim 8, wherein the barrier material is selected from the group consisting of titanium, titanium nitride, titanium-titanium nitride, tungsten, titanium-tungsten, tantalum, or tantalum nitride.

16. The semiconductor device according to claim 15, wherein the barrier layer comprises titanium nitride deposited by chemical vapor deposition, the metal feature comprises aluminum; and the conductive material comprises tungsten deposited from tungsten hexafluoride.

* * * * *

UNITED STATES PATENT AND TRADEMARK OFFICE
CERTIFICATE OF CORRECTION

PATENT NO. : 5,982,035
DATED : November 9, 1999
INVENTOR(S) : Tran et al.

It is certified that error appears in the above-identified patent and that said Letters Patent is hereby corrected as shown below:

Claim 14,
Line 3, change "1,000 Å" to -- 1,500 Å --.

Signed and Sealed this

Twenty-third Day of October, 2001

Attest:

*Nicholas P. Godici*

NICHOLAS P. GODICI
*Attesting Officer*       *Acting Director of the United States Patent and Trademark Office*